United States Patent
Kim et al.

(10) Patent No.: US 7,749,902 B2
(45) Date of Patent: Jul. 6, 2010

(54) METHODS OF MANUFACTURING SEMICONDUCTOR DEVICE

(75) Inventors: Hyun-chul Kim, Seoul (KR); Sung-il Cho, Seoul (KR); Jae-seung Hwang, Gyeonggi-do (KR); Jun Sen, Gyeonggi-do (KR); Yong-hyun Kwon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 612 days.

(21) Appl. No.: 11/825,272

(22) Filed: Jun. 5, 2007

(65) Prior Publication Data

US 2008/0194108 A1    Aug. 14, 2008

(30) Foreign Application Priority Data

Feb. 13, 2007    (KR) .................... 10-2007-0015086

(51) Int. Cl.
  *H01L 21/44*    (2006.01)
  *H01L 21/302*   (2006.01)
  *H01L 21/461*   (2006.01)
  *C03C 15/00*    (2006.01)
  *C03C 25/68*    (2006.01)
  *C23F 1/00*     (2006.01)

(52) U.S. Cl. ................ 438/671; 438/717; 438/736; 438/942; 438/946; 438/947; 216/47; 216/72

(58) Field of Classification Search .................. 216/47, 216/64; 438/671, 717, 736
See application file for complete search history.

(56) References Cited

U.S. PATENT DOCUMENTS

| 2008/0048340 | A1* | 2/2008 | Lee et al. ............ 257/774 |
| 2009/0179004 | A1* | 7/2009 | Kajiwara ............ 216/47 |

FOREIGN PATENT DOCUMENTS

| KR | 1020010065191 A | 7/2001 |
| KR | 1020010084825 A | 9/2001 |

\* cited by examiner

*Primary Examiner*—Ha Tran T Nguyen
*Assistant Examiner*—Valerie Brown
(74) *Attorney, Agent, or Firm*—Myers Bigel Sibley & Sajovec, P.A.

(57) ABSTRACT

Provided is a method of manufacturing a semiconductor device using double patterning. The method includes: forming a first material layer pattern having recesses in a first direction on an object layer and a second material layer pattern formed on the first material layer pattern; selectively etching the second material layer pattern and the first material layer pattern in a direction perpendicular to the first direction to form an etching mask; and etching the object layer to form minute patterns.

30 Claims, 19 Drawing Sheets

METHODS OF MANUFACTURING SEMICONDUCTOR DEVICE

CROSS-REFERENCE TO RELATED PATENT APPLICATION

This application claims the benefit of Korean Patent Application No. 10-2007-0015086, filed on Feb. 13, 2007, in the Korean Intellectual Property Office, the disclosure of which is incorporated herein in its entirety by reference.

FIELD OF THE INVENTION

The present invention relates generally to semiconductor devices, and more particularly, to methods of manufacturing semiconductor devices.

BACKGROUND OF THE INVENTION

As the integration degree of semiconductor devices has increased, the size and interval (pitch) of patterns constituting circuits has also been reduced. Accordingly, minute patterns should be formed. However, it can be difficult to form minute patterns that can be applied to semiconductor devices using, for example, a KrF light source (245 nm) or ArF light source (193 nm).

SUMMARY

The present invention provides methods of manufacturing semiconductor devices by double patterning.

According to embodiments of the present invention, a method of manufacturing a semiconductor device includes: (a) forming a first material layer having a first thickness on an objective layer; (b) forming a second material layer having a second thickness on the first material layer; (c) forming first patterns of a third material layer having lines and space patterns on the second material layer; (d) forming first patterns of the second material layer by etching the second material layer using the first patterns of the third material layer as an etching mask; (e) forming first patterns of the first material layer by etching the first material layer exposed by the etching mask including the first patterns of the second material layer to have a third thickness that is smaller than the first thickness; (f) forming second patterns of the second material layer having a planarized top surface on the first patterns of the first material layer and the first patterns of the second material layer, a fourth thickness on the first patterns of the second material layer, and a fifth thickness on the first patterns of the first material layer having the third thickness; (g) forming second patterns of the third material layer having lines and space patterns in a direction perpendicular to the first patterns of the third material layer on the second patterns of the second material layer; (h) forming third patterns of the second material layer by etching the second patterns of the second material layer and the first patterns of the second material layer by a first depth that is smaller than the fifth thickness from the top surface of the second patterns of the second material layer using the second patterns of the third material layer as an etching mask; (i) forming second patterns of the first material layer by etching the first patterns of the first material layer that is exposed by the etching mask including the third patterns of the second material layer by the same depth as the first thickness; and (j) etching the object layer exposed by the etching mask including the second patterns of the first material layer.

In step (h), the first depth may be equal to the sum of the fourth thickness and the second thickness. The third thickness in step (e) may be equal to or greater than a minimum thickness of the second patterns of the first material layer that are determined such that the second patterns of the first material layer can remain when etching the object layer. The object layer, the first material layer, the second material layer, and the third material layer may have different etching selectivities to one another. The first material layer may be formed of a material that can be removed by an ashing process or a strip process.

The method may further comprise, after step (j), removing the second patterns of the first material layer using an ashing process or a strip process. The second material layer may be formed of a material that has an adhesive force with respect to the first material layer and fill recesses formed in the first material layer. The first material layer may comprise an amorphous carbon layer (ACL). The ACL may be formed using a coating method or a chemical vapor deposition (CVD) method. The second material layer may comprise SiON. The third material layer may comprise a photoresist layer.

Step (d) of forming the first patterns of the second material layer or step (h) of forming the third patterns of the second material layer may comprise using etching gas containing at least one gas selected from a group consisting of $CF_4$, $CHF_3$, $CH_2F_2$, and $CH_3F$. Step (e) of forming the first patterns of the first material or step (i) of forming the second patterns of the first material layer may comprise using etching gas containing $O_2$ gas. Step (j) of etching the object layer may use etching gas containing at least one gas selected from a group consisting of $CF_4$, $CHF_3$, $CH_2F_2$, $C_4F_6$, $C_5F_8$, $C_3F_8$, and $C_2F_6$. In step (e), the difference between the first thickness and the third thickness may be 1.5 times or greater the sum of the second thickness and the fourth thickness or greater. The second material layer may comprise an oxide layer.

According to other embodiments of the present invention, a method of manufacturing a semiconductor device includes: (a) forming a first material layer on an object layer on a semiconductor substrate; (b) forming a second material layer on the first material layer; (c) forming first patterns of a third material layer, in which a plurality of first line patterns are separated in parallel from one another, on the second material layer; (d) forming first patterns of the second material layer by etching the second material layer using the first patterns of the third material layer as an etching mask; (e) forming first patterns of the first material layer having recesses by etching a portion of the first material layer exposed by the etching mask comprising the first patterns of the second material layer; (f) forming second patterns of the second material layer which fill the recesses and is planarized on the first patterns of the second material layer; (g) forming second patterns of the third material layer formed of second line patterns that are separated in parallel to one another in a direction perpendicular to the first line patterns, on the second patterns of the second material layer; (h) forming third patterns of the second material layer by etching the first patterns of the second material layer and the second patterns of the second material layer until the first patterns of the first material layer is exposed for the first time using the second patterns of the third material layer as an etching mask; (i) forming second patterns of the first material layer by etching the first patterns of the first material layer that is exposed by the etching mask comprising the third patterns of the second material layer until the object layer is exposed for the first time; and (j) forming semiconductor patterns by etching the object layer that is exposed by the etching mask comprising the second patterns of the first material layer. The object layer, the first material layer, the second material layer, and the third material layer may have different etching selectivities to one another. The first material layer may be formed of a material that can be removed by an ashing process or a strip process.

The method may further comprise, after step (j), removing the second patterns of the first material layer using an ashing process or a strip process. The second material layer may be formed of a material that has adhesive force with respect to the first material layer and fill recesses formed in the first material layer. The first material layer may comprise an amorphous carbon layer (ACL). The ACL may be formed using a coating method or a chemical vapor deposition (CVD) method. The second material layer may comprise SiON. The third material layer may comprise a photoresist layer. Step (d) of forming the first patterns of the second material layer or step (h) of forming the third patterns of the second material layer may comprise using etching gas containing at least one gas selected from a group consisting of $CF_4$, $CHF_3$, $CH_2F_2$, and $CH_3F$. Step (e) of forming the first patterns of the first material or step (i) of forming the second patterns of the first material layer may comprise using etching gas containing $O_2$ gas. Step (j) of etching the object layer may use etching gas containing at least one gas selected from a group consisting of $CF_4$, $CHF_3$, $CH_2F_2$, $C_4F_6$, $C_5F_8$, $C_3F_8$, and $C_2F_6$.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1A:
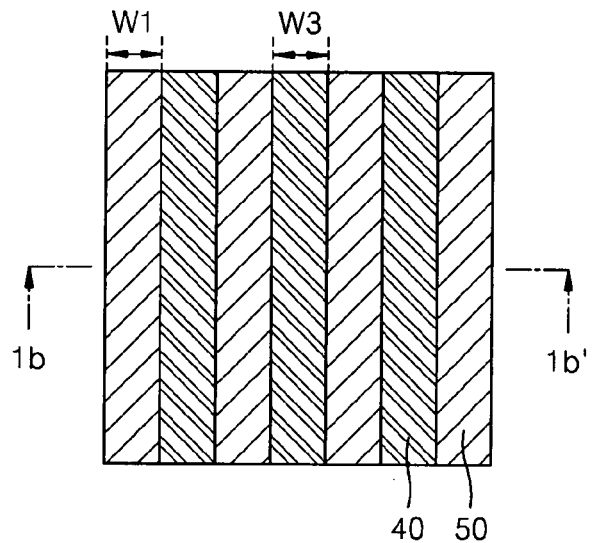
FIGS. 1A, 2A, 3A, 4A, 5A, 6A, and 7A are plan views of a semiconductor device illustrating a method of manufacturing the semiconductor device according to an embodiment of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly. Moreover, the term "beneath" indicates a relationship of one layer or region to another layer or region relative to the substrate, as illustrated in the figures.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to plan and cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Figure 1B:
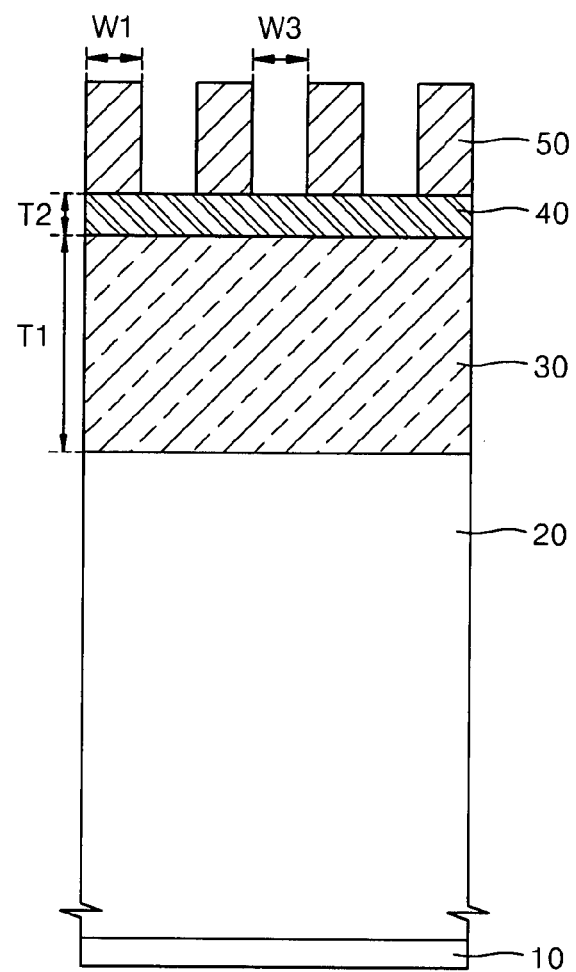
FIG. 1B is a cross-sectional view of the semiconductor device of FIG. 1A taken along line 1B-1B' of FIG. 1A.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. Referring to FIGS. 1A and 1B, a method of manufacturing a semiconductor device according to embodiments of the present invention is illustrated. A first material layer 30 having a first thickness T1 is formed on an object layer 20. The object layer 20 may be formed on a stopper layer 10. A second material layer 40 having a second thickness T2 is formed on the first material layer 30. First patterns 50 of a third material layer having a line and space patterns are formed on the second material layer 40. The line patterns have a first width W1 and are separated by a third width W3.

According to an embodiment of the present invention, the object layer 20 may include an oxide layer, the first material layer 30 may include an amorphous carbon layer (ACL), the second material layer 40 may include SiON or oxide layer, and the third material layer may include a photoresist layer. However, the object layer 20, the first material layer 30, the second material layer 40, and the third material layer are not limited to the above configuration when they are formed of materials having different etching selectivity to one another. The second material layer 40 may be formed of a material that has an adhesive force to the first material layer 30 and that can fill recesses formed in the first material layer 30. The first material layer 30 including the ACL may be formed by coating or using a chemical vapor deposition (CVD) method.

Figure 2A:
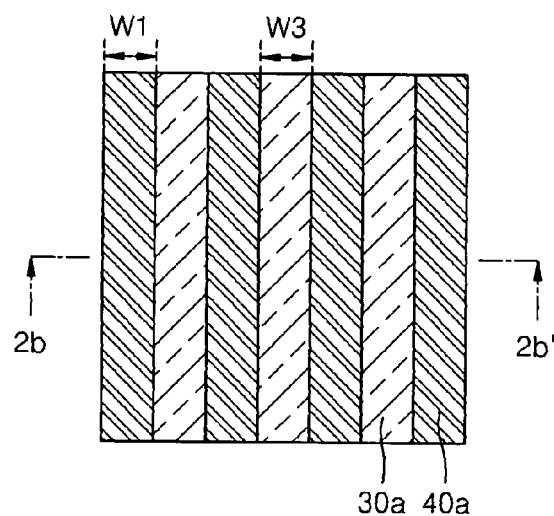
Figure 2B:
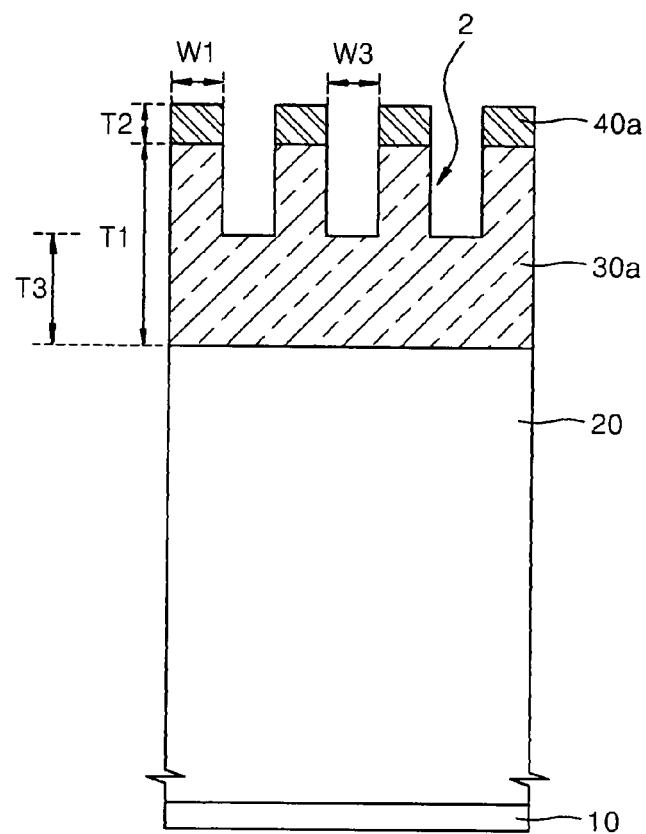
FIG. 2B is a cross-sectional view of the semiconductor device of FIG. 2A taken along line 2B-2B' of FIG. 2A.

Referring to FIGS. 2A and 2B, the first patterns of the third material layer (50 in FIG. 1B) are used as an etching mask to etch the second material layer (40 in FIG. 1B) to form a first patterns 40a of the second material layer 40. In this case, when the second material layer 40 includes SiON, and the third material layer includes a photoresist layer, the second material layer 40 is etched using an etching gas containing at least one selected from the group consisting of $CF_4$, $CHF_3$, $CH_2F_2$, and $CH_3F$. Meanwhile, when the second material layer 40 is etched, the first patterns 50 of the third material layer are etched to be entirely removed or may partially remain on the first patterns 40a of the second material layer 40. The first material layer 30 that is exposed by an etching mask including the first patterns 40a of the second material layer 40 is partially etched to form first patterns 30a of the first material layer 30 having recesses 2. In this case, when the first material layer 30 includes ACL, and the second material layer 40 includes SiON, the first material layer 30 may be etched using an etching gas containing $O_2$ gas. The first patterns 30a include a first region exposed by the etching mask including the first patterns 40a of the second material layer 40 and a second region that is not exposed by the etching mask including the first patterns 40a of the second material layer 40. That is, the first region is the first patterns 30a of the first material layer 30 formed below the recesses 2 and has a third thickness T3 and a third width W3. Since recesses 2 need to be formed, the third thickness T3 is smaller than the first thickness T1.

Figure 3A:
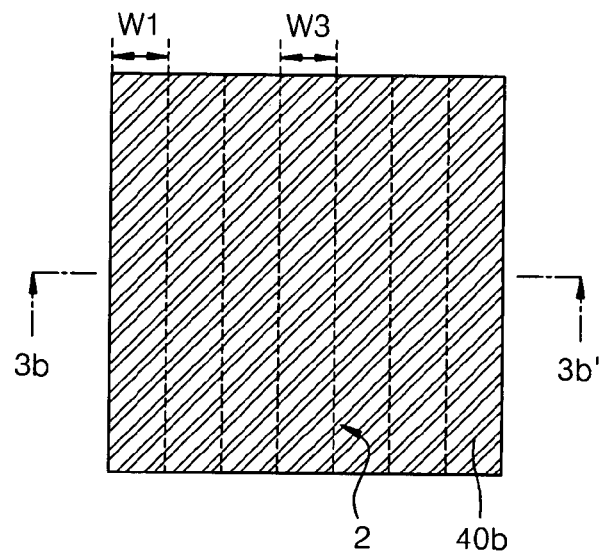
Figure 3B:
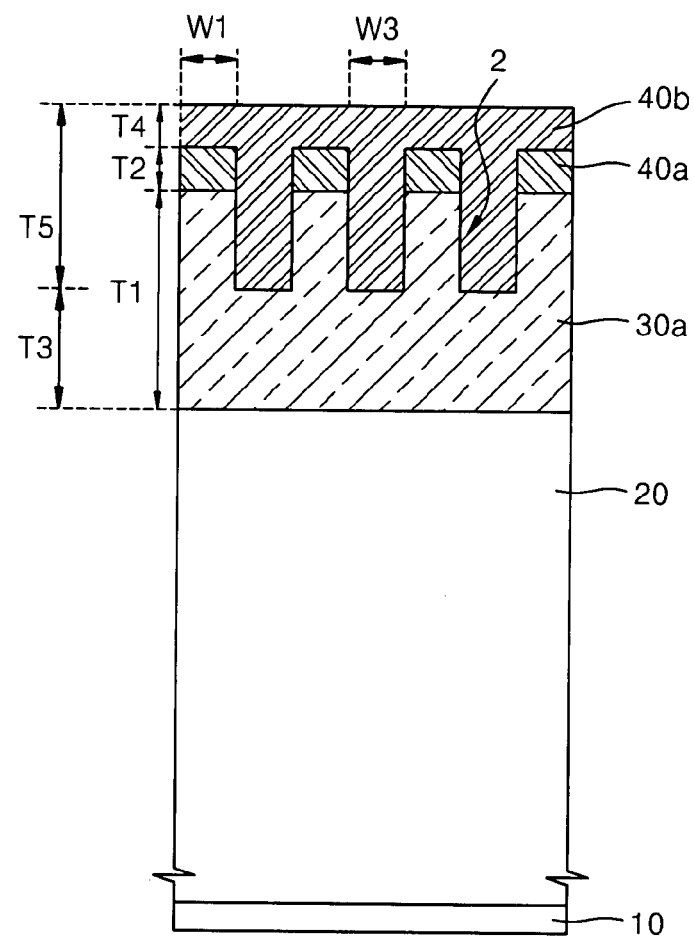
FIG. 3B is a cross-sectional view of the semiconductor device of FIG. 3A taken along line 3B-3B' of FIG. 3A.

Referring to FIGS. 3A and 3B, second patterns 40b of the second material layer 40, which have a planarized top surface on the first patterns 30a of the first material layer 30 and the first patterns 40a of the second material layer 40, a fourth thickness T4 on the first patterns 40a of the second material layer 40, and a fifth thickness T5 on the first patterns 30a of the first material layer 30 are formed. That is, the second patterns 40b of the second material layer 40 fill the recesses 2 and have a planarized top surface on the first patterns 40a of the second material layer 40. As described before, the second patterns 40b of the second material layer 40 have the fifth thickness T5 in the first region, and the fourth thickness T4 in the second region.

Figure 4A:
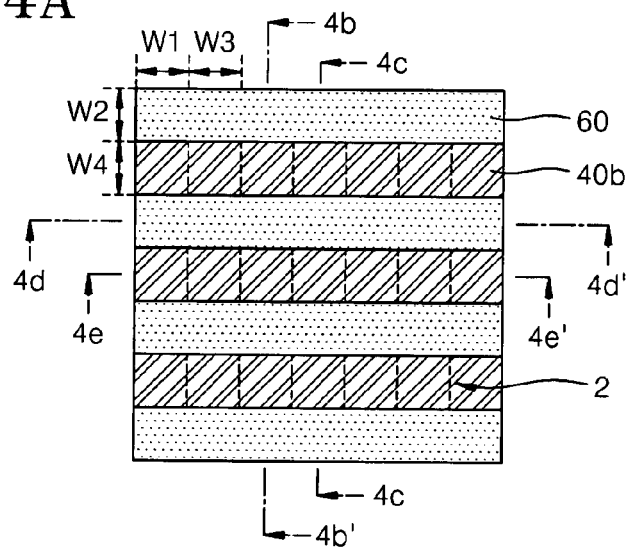

Referring to FIG. 4A, second patterns 60 of the third material layer having line and space patterns in a vertical direction to the first patterns (50 in FIG. 1A) of the third material layer are formed on the second patterns 40b of the second material layer 40. The second patterns 60 of the third material layer include line patterns having a second width W2, which are parallel to and separated from each other by a fourth width W4. Hereinafter, cross-sections of the semiconductor device in which second patterns 60 of the third material layer are formed will be described.

Figure 4B:
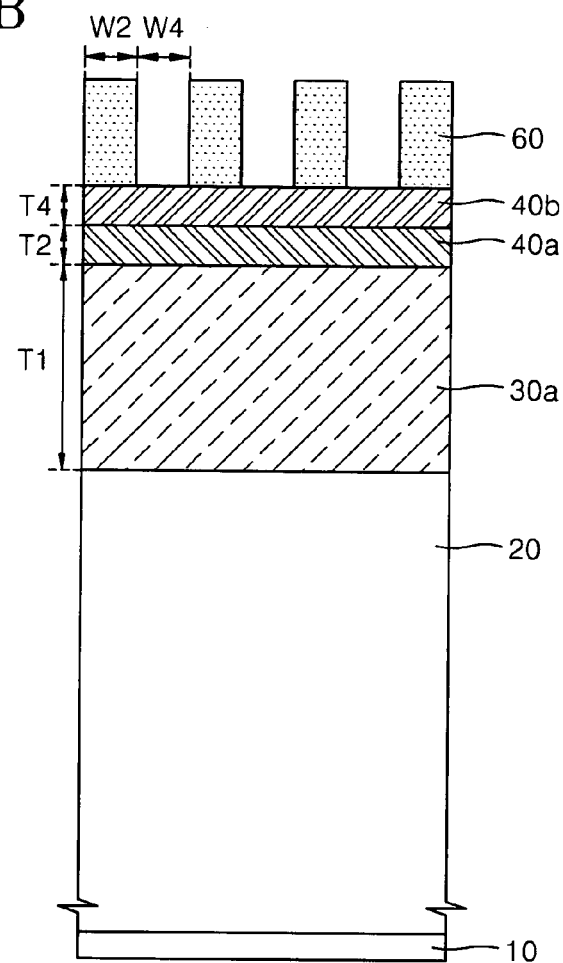
FIG. 4B is a cross-sectional view of the semiconductor device of FIG. 4A taken along line 4B-4B' of FIG. 4A.

First, referring to FIG. 4B showing the cross-sectional view taken along line 4B-4B' in FIG. 4A, the first patterns 30a of the first material layer 30 have the first thickness T1, the first patterns 40a of the second material layer 40 have the second thickness T2, and the second patterns 40b of the second material layer 40 have the fourth thickness T4. The second patterns 60 of the third material layer have the second width W2 and are separated from each other by the fourth width W4.

Figure 4C:
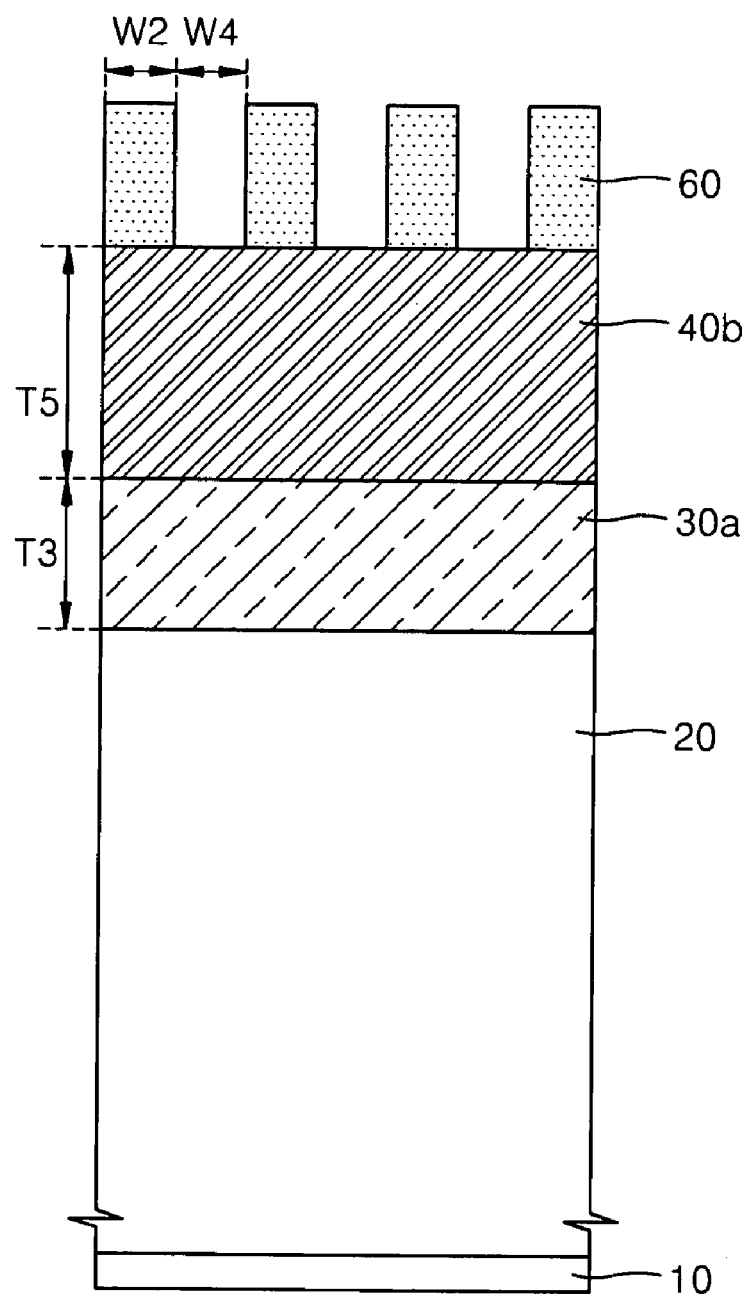
FIG. 4C is a cross-sectional view of the semiconductor device of FIG. 4A taken along line 4C-4C' of FIG. 4A.

Referring to FIG. 4C showing the cross-sectional view taken along line 4C-4C' of FIG. 4A, the first patterns 30a of the first material layer 30 have the third thickness T3, the first patterns 40a of the second material layer 40 are not formed, and the second patterns 40b of the second material layer 40 have the fifth thickness T5. The second patterns 60 of the third material layer have the second width W2 and are separated from each other by the fourth width W4.

Figure 4D:
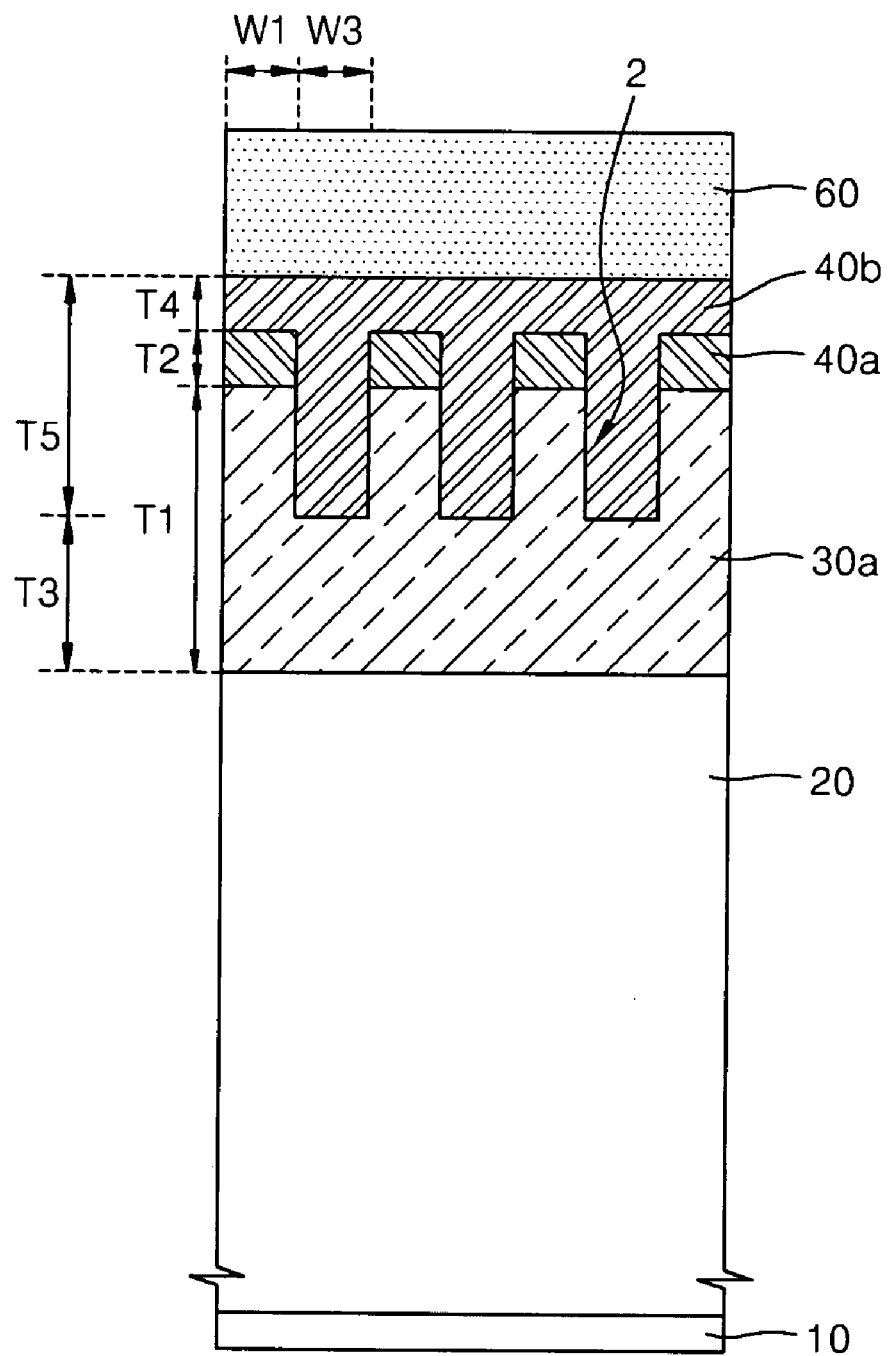
FIG. 4D is a cross-sectional view of the semiconductor device of FIG. 4A taken along line 4D-4D' of FIG. 4A.

Referring to FIG. 4D showing the cross-sectional view taken along line 4D-4D' of FIG. 4A, the first patterns 30a of the first material layer 30 have the first thickness T1 in the second region where the first patterns 40a of the second material layer 40 are formed and the third thickness T3 in the first region where the first patterns 40a of the second material layer 40 are not formed. The first region has the third width W3 and the second region has the first width W1. The second patterns 40b of the second material layer 40, which fill the recesses 2 formed in the first patterns 30a of the first material layer 30 and have a planarized top surface on the first patterns 40a of the second material layer 40, have the fifth thickness T5 in the first region and the fourth thickness T4 in the second region. Second patterns 60 of the third material layer are formed on the second patterns 40b of the second material layer 40.

Figure 4E:
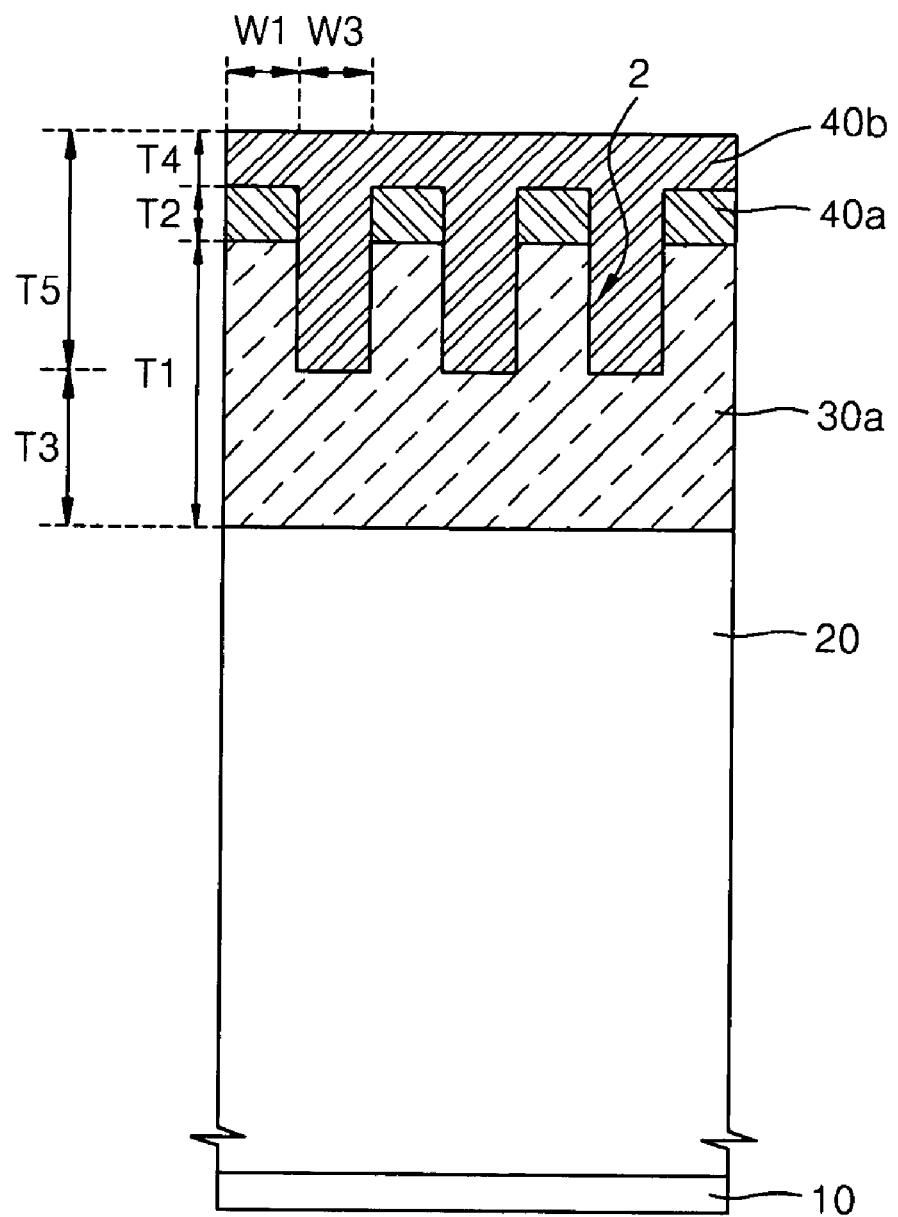
FIG. 4E is a cross-sectional view of the semiconductor device of FIG. 4A taken along line 4E-4E' of FIG. 4A.

Referring to FIG. 4E showing the cross-sectional view taken along line 4E-4E' of FIG. 4A, the first patterns 30a of the first material layer 30 have the first thickness T1 in the second region where the first patterns 40a of the second material layer 40 are formed and the third thickness T3 where the first patterns 40a of the second material layer 40 are not formed. The first region has the third width W3 and the second region has the first width W1. The second patterns 40b of the second material layer 40, which fill the recesses 2 formed in the first patterns 30a of the first material layer 30 and have a planarized top surface on the first patterns 40a of the second material layer 40, have the fifth thickness T5 in the first region and the fourth thickness T4 in the second region. Second patterns 60 of the third material layer are not formed on the second patterns 40b of the second material layer 40. The difference between the first thickness T1 and the third thickness T3 may be 1.5 times or greater the sum of the second thickness T2 and the fourth thickness T4 (i.e., T1−T3≧1.5 (T2+T4)) in order to secure third patterns (40c in FIG. 6E) of the second material layer 40 that are formed as an etching mask on the second patterns (30b in FIG. 6E) of the first material layer 30 having the third width in subsequent processes.

Figure 5A:
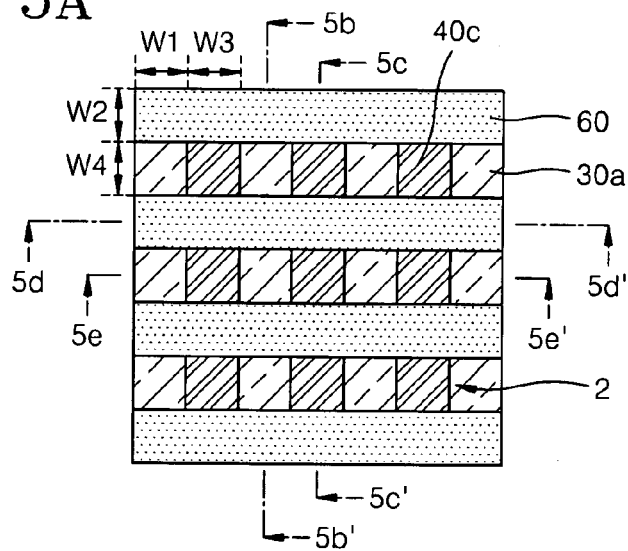

Referring to FIG. 5A, the second patterns 60 of the third material layer are used as an etching mask to etch the second patterns 40b of the second material layer 40 and the first patterns 40a of the second material layer 40 from the top surface of the second patterns 40b of the second material layer 40 to a first depth H1 to form third patterns 40c and 40d of the second material layer 40. In this case, when the second material layer 40 includes SiON and the third material layer includes a photoresist layer, the second material layer 40 is etched using an etching gas containing at least one selected from the group consisting of $CF_4$, $CHF_3$, $CH_2F_2$, and $CH_3F$. Meanwhile, when the second material layer 40 is etched, the second patterns 60 of the third material layer are all etched to be entirely removed or may partially remain on the third patterns 40c and 40d of the second material layer 40. When the second patterns 30 of the third material layer are all etched and entirely removed, the second patterns 40b of the second material layer 40 are all etched and thus only the first patterns 40a of the second material layer 40 remains to form the third patterns 40d of the second material layer 40. Hereinafter, cross-sections of the semiconductor device in which the third patterns 40c and 40d of the second material layer will be described.

Figure 5B:
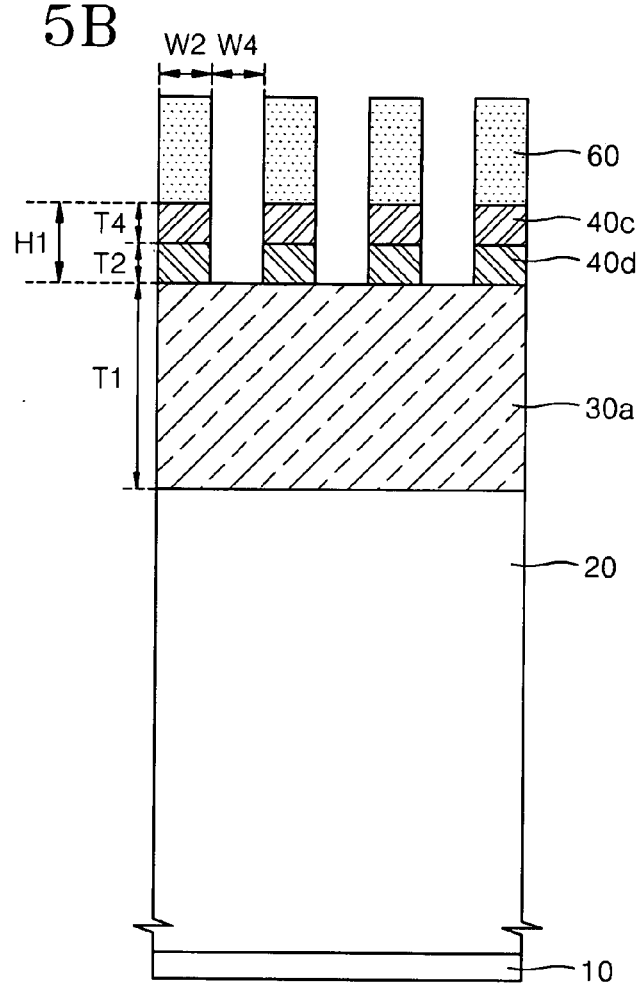
FIG. 5B is a cross-sectional view of the semiconductor device of FIG. 5A taken along line 5B-5B' of FIG. 5A.

Referring to FIGS. 4B and 5B, the cross-sectional view taken along lines 5B-5B' of FIG. 5A shows the second patterns 60 of the third material layer are used as an etching mask to etch the second patterns 40b of the second material layer 40 and the first patterns 40a of the second material layer 40 from a top surface of the second patterns 40b of the second material layer 40 to the first depth H1 to form third patterns 40c and 40d of the second material layer 40. The first depth H1 may be equal to the sum of the fourth thickness T4 and the second thickness T2.

Figure 5C:
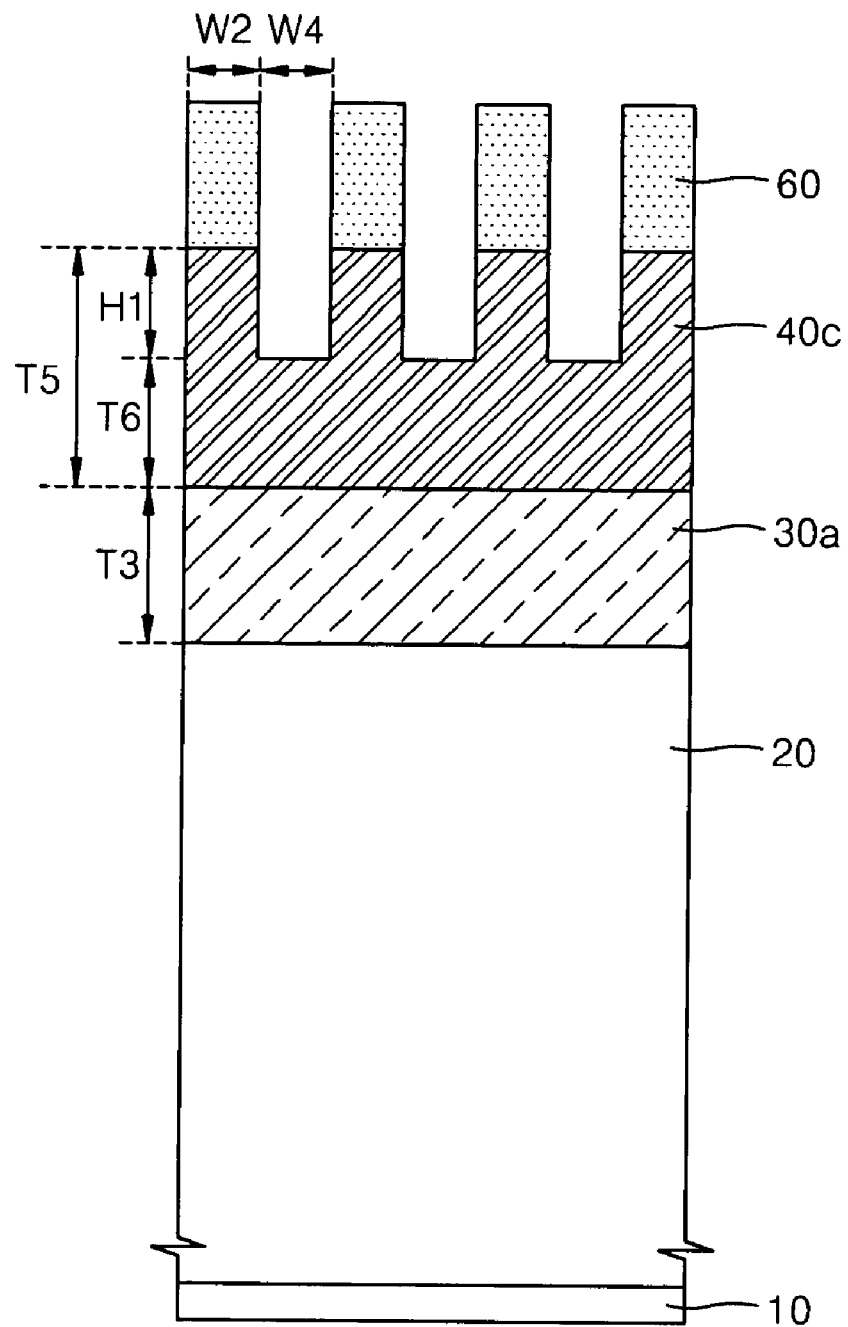
FIG. 5C is a cross-sectional view of the semiconductor device of FIG. 5A taken along line 5C-5C' of FIG. 5A.

Referring to FIGS. 4C and 5C, the second patterns 40b of the second material layer 40 are etched using the second patterns 60 of the third material layer as an etching mask, as illustrated in the cross-sectional view taken along line 5C-5C' of FIG. 5A, from a top surface of the second patterns 40b of the second material layer 40 to the first depth H1 to form the third patterns 40c of the second material layer 40. The first depth H1 may be smaller than the fifth thickness T5.

Figure 5D:
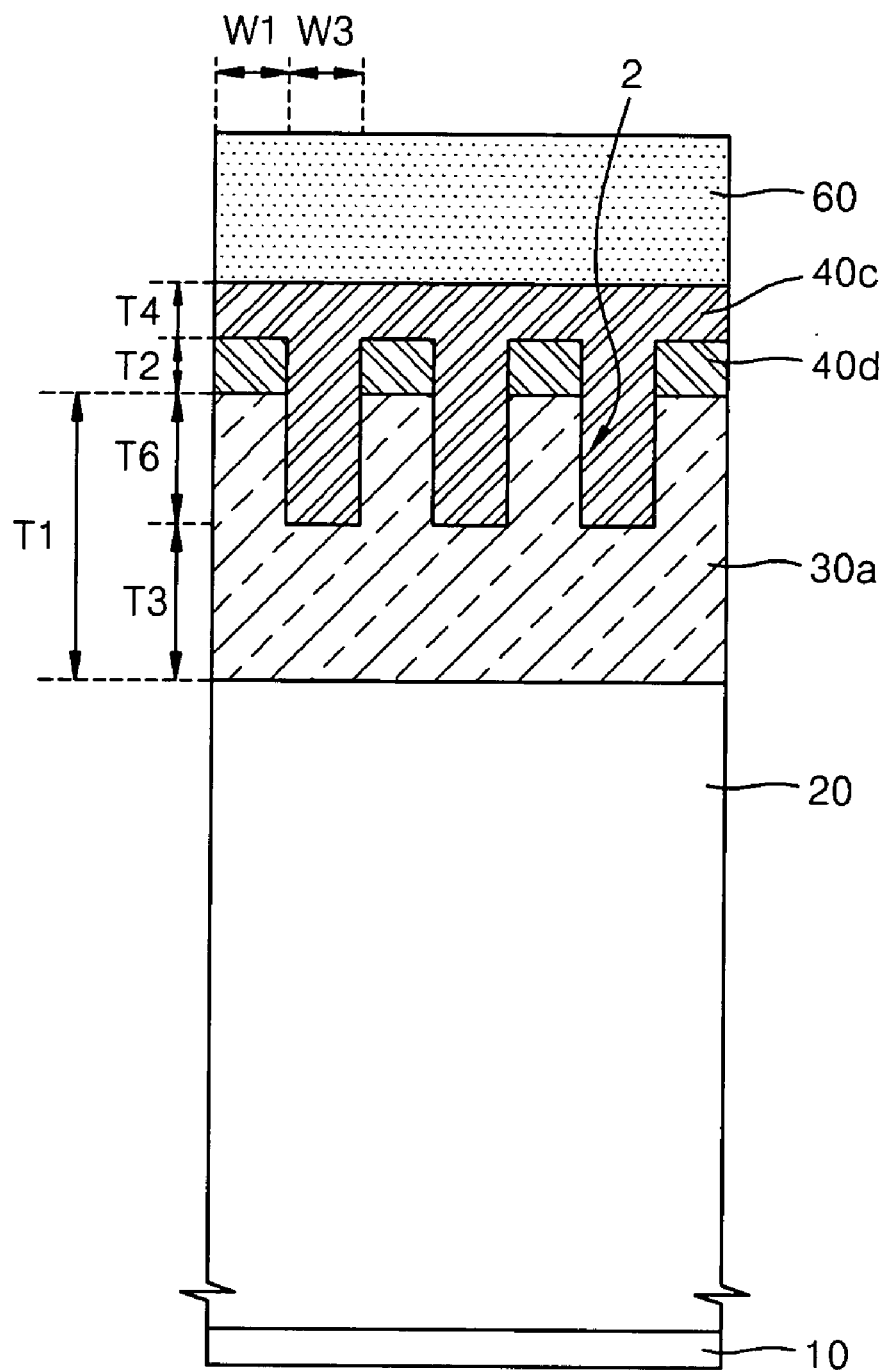
FIG. 5D is a cross-sectional view of the semiconductor device of FIG. 5A taken along line 5D-5D' of FIG. 5A.

Referring to FIGS. 4D and 5D, the cross-sectional view taken along line 5D-5D' of FIG. 5A shows the second patterns 60 of the third material layer are used as an etching mask to etch the second material layer 40, and thus the third patterns 40c and 40d of the second material layer 40 are not etched.

Figure 5E:
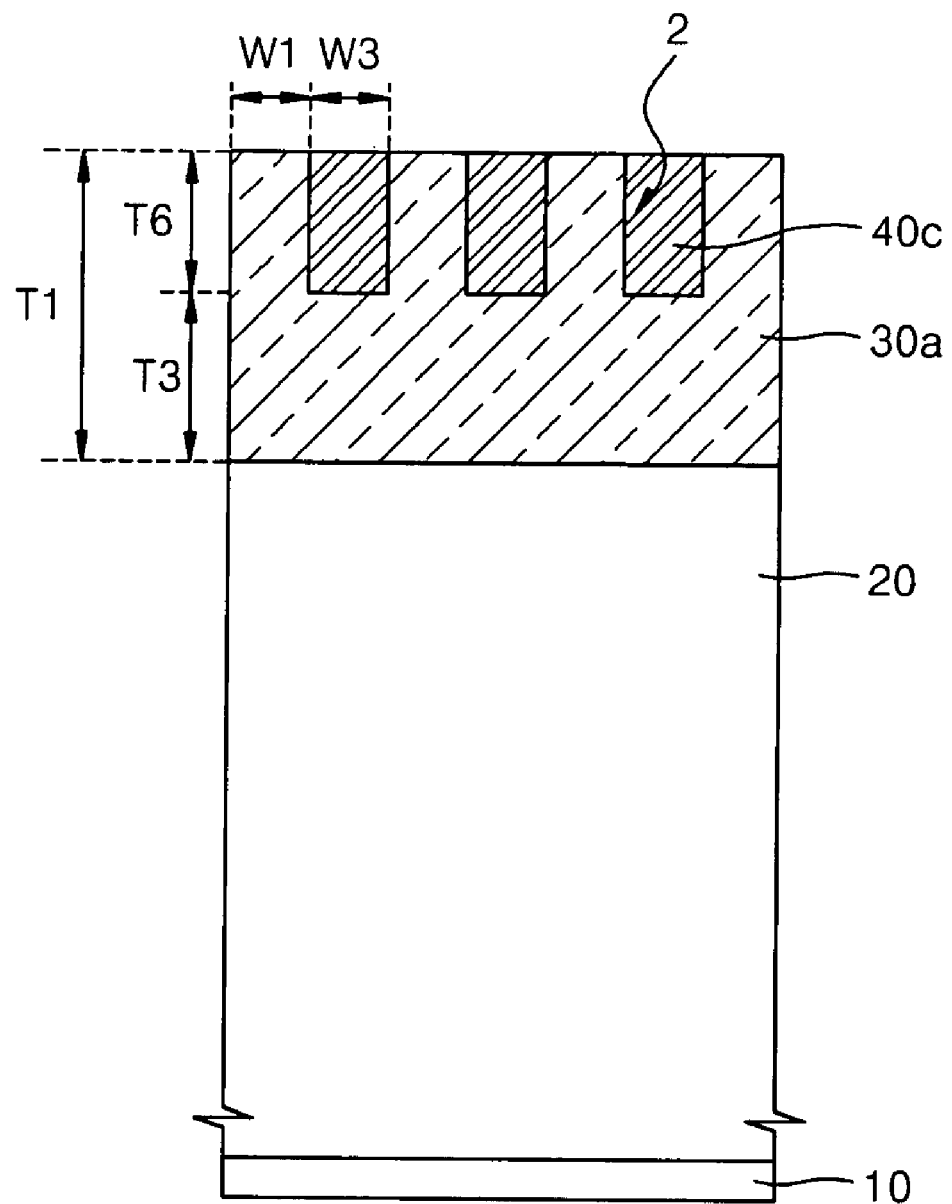
FIG. 5E is a cross-sectional view of the semiconductor device of FIG. 5A taken along line 5E-5E' of FIG. 5A.

Referring to FIGS. 4E and 5E, the cross-sectional view taken along a line 5E-5E' of FIG. 5A shows the second patterns 60 of the third material layer are used as an etching mask to etch the second patterns 40b of the second material layer 40 and the first patterns 40a of the second material layer 40 to a depth equal to the sum of the fourth thickness T4 and the second thickness T2 to form the third patterns 40c of the second material layer. In other words, in the first region having the third width W3, the third patterns 40c of the second material layer 40 remaining only to a sixth thickness is formed, and the first patterns 40a of the first material layer 30 having the third thickness are formed. Meanwhile, in the second region having the first width W1, the first patterns 40a of the second material layer 40 and the second patterns 40b of the second material layer 40 are all etched to be removed, and the first patterns 30a of the first material layer 30 having the first thickness is formed.

According to an embodiment of the present invention, the second patterns 40b of the second material layer 40 and the first patterns 40a of the second material layer 40 are etched to the first depth that is equal to the sum of the fourth thickness T4 and the second thickness T2 from a top surface of the second patterns 40b of the second material layer 40 using the second patterns 60 of the third material layer as an etching mask to form third patterns 40c and 40d of the second material layer 40. Meanwhile, the second patterns 40b of the second material layer 40 and the first patterns 40a of the second material layer 40 are etched until the first patterns 30a of the first material layer 30 are exposed for the first time using the second patterns 60 of the third material layer as an etching mask to form third patterns 40c and 40d of the second material layer 40. When the second patterns 40b of the second material layer 40 and the first patterns 40a of the second material layer 40 are etched until the first patterns 30a of the first material layer 30 are exposed for the first time, the first patterns 30a of the first material layer 30 is exposed in the cross-sections illustrated in FIGS. 5B and 5E, but is not exposed in the cross-sections illustrated in FIGS. 5C and 5D.

Figure 6A:
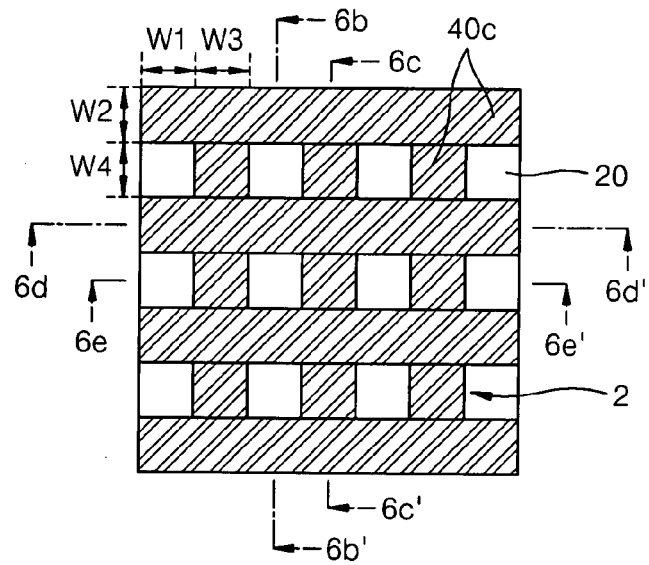

Referring to FIG. 6A, the first patterns 30a of the first material layer 30 exposed by the etching mask including the third patterns 30b of the second material layer 40 are etched to the depth equal to the first thickness T1 to form the second patterns 30b of the first material layer 30. In this case, when the first material layer 30 includes ACL and the second material layer 40 includes SiON, the first material layer 30 can be etched using an etching gas containing $O_2$ gas. The third patterns 40c and 40d of the second material layer 40 used as an etching mask while the first material 30 are etched, are all etched to be entirely removed or may partially remain on the second patterns 30b of the first material layer 30. Hereinafter, cross-sections of the semiconductor device in which the second patterns 30b of the first material layer 30 will be described.

Figure 6B:
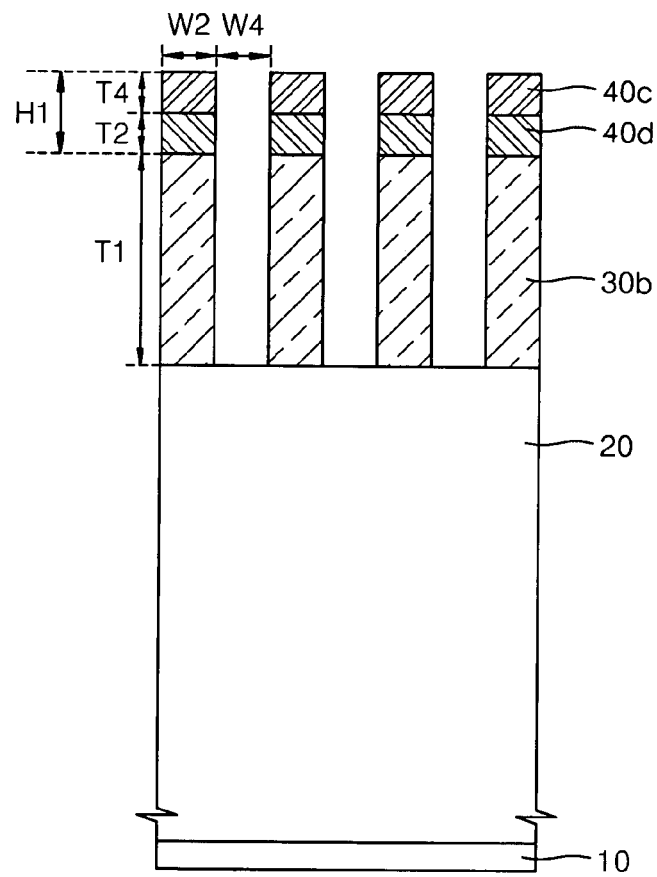
FIG. 6B is a cross-sectional view of the semiconductor device of FIG. 6A taken along line 6B-6B' of FIG. 6A.

First, referring to FIGS. 5B and 6B showing the cross-sectional view taken along line 6B-6B' of FIG. 6A, the first patterns 30a of the first material layer 30 exposed by the etching mask including the third patterns 40c and 40d of the second material layer 40 are etched to the depth equal to the first thickness T1 to form the second patterns 30b of the first material layer 30 and the object layer 20 is exposed to the fourth width W4.

Figure 6C:
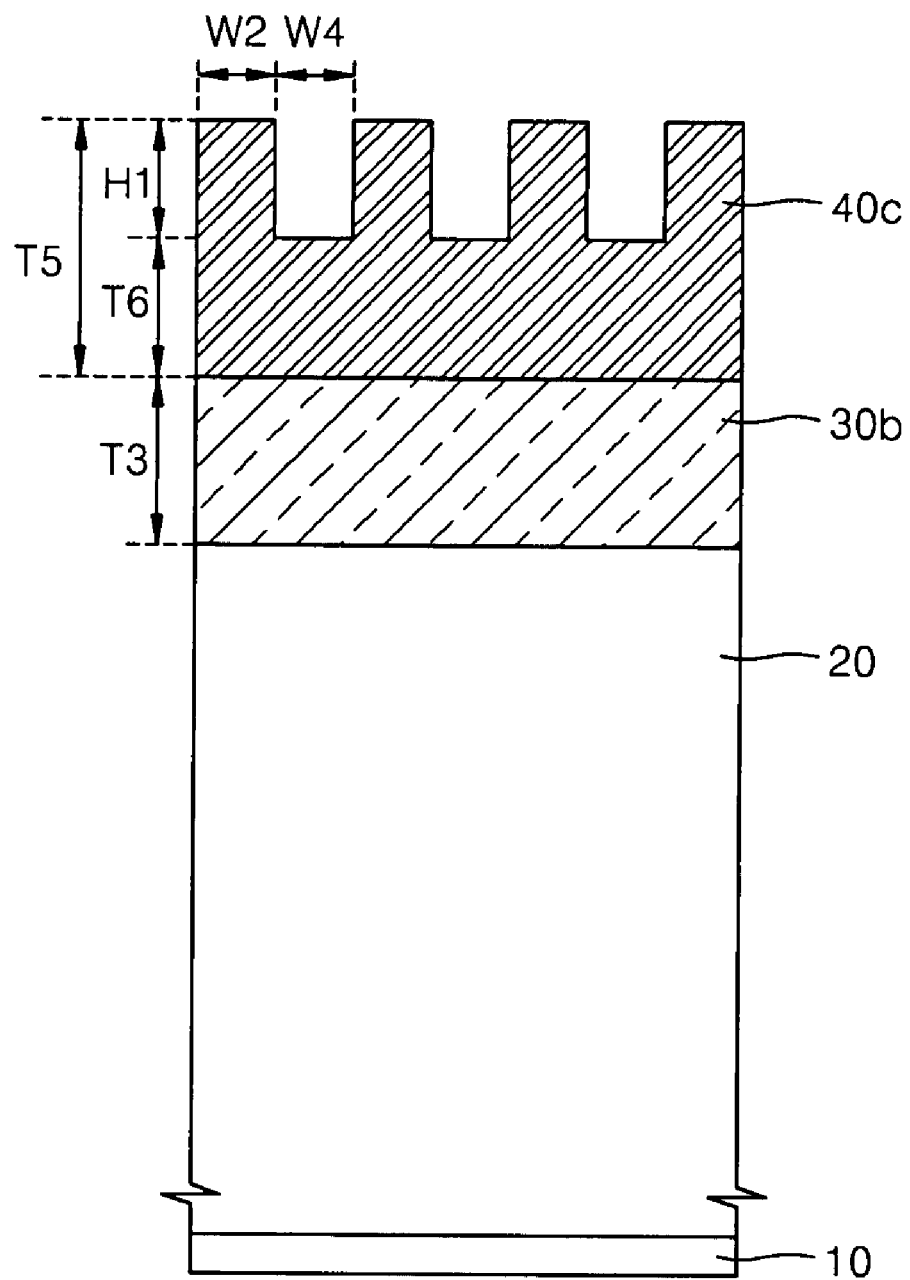
FIG. 6C is a cross-sectional view of the semiconductor device of FIG. 6A taken along line 6C-6C' of FIG. 6A.

Referring to FIGS. 5C and 6C showing the cross-sectional view taken along a line 6C-6C' of FIG. 6A, since the first material layer 30 exposed by the etching mask including the third patterns 40c of the second material layer 40 is not present, the first patterns 30a of the first material layer 30 having the third thickness T3 is not etched.

Figure 6D:
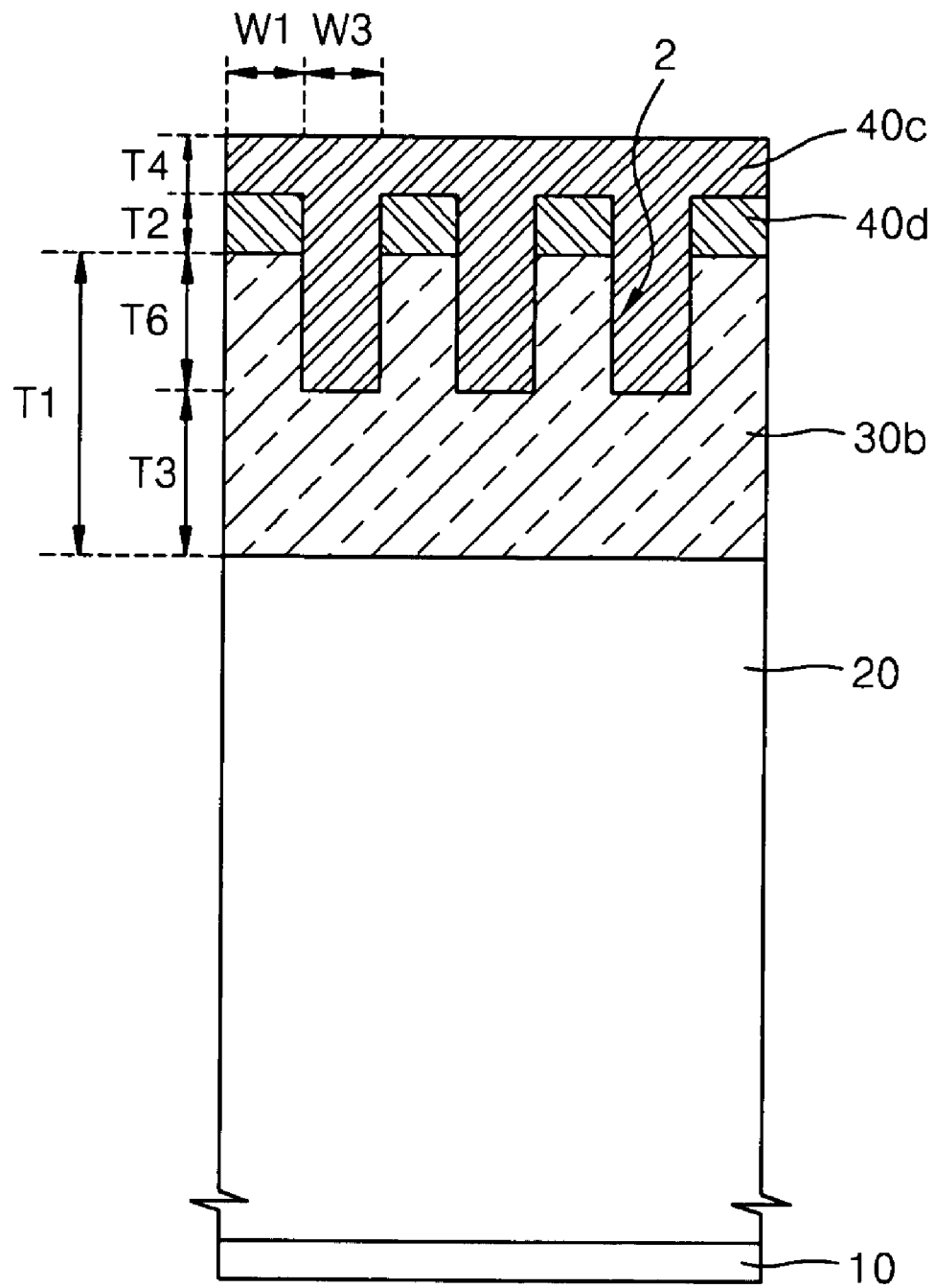
FIG. 6D is a cross-sectional view of the semiconductor device of FIG. 6A taken along line 6D-6D' of FIG. 6A.

Referring to FIGS. 5D and 6D showing the cross-sectional view taken along a line 6D-6D' of FIG. 6A, since the first material layer 30 exposed by the etching mask including the third patterns 40c of the second material layer 40 is not present, the first patterns 30a of the first material layer 30 having the third thickness T3 and the first thickness T1 is not etched.

Figure 6E:
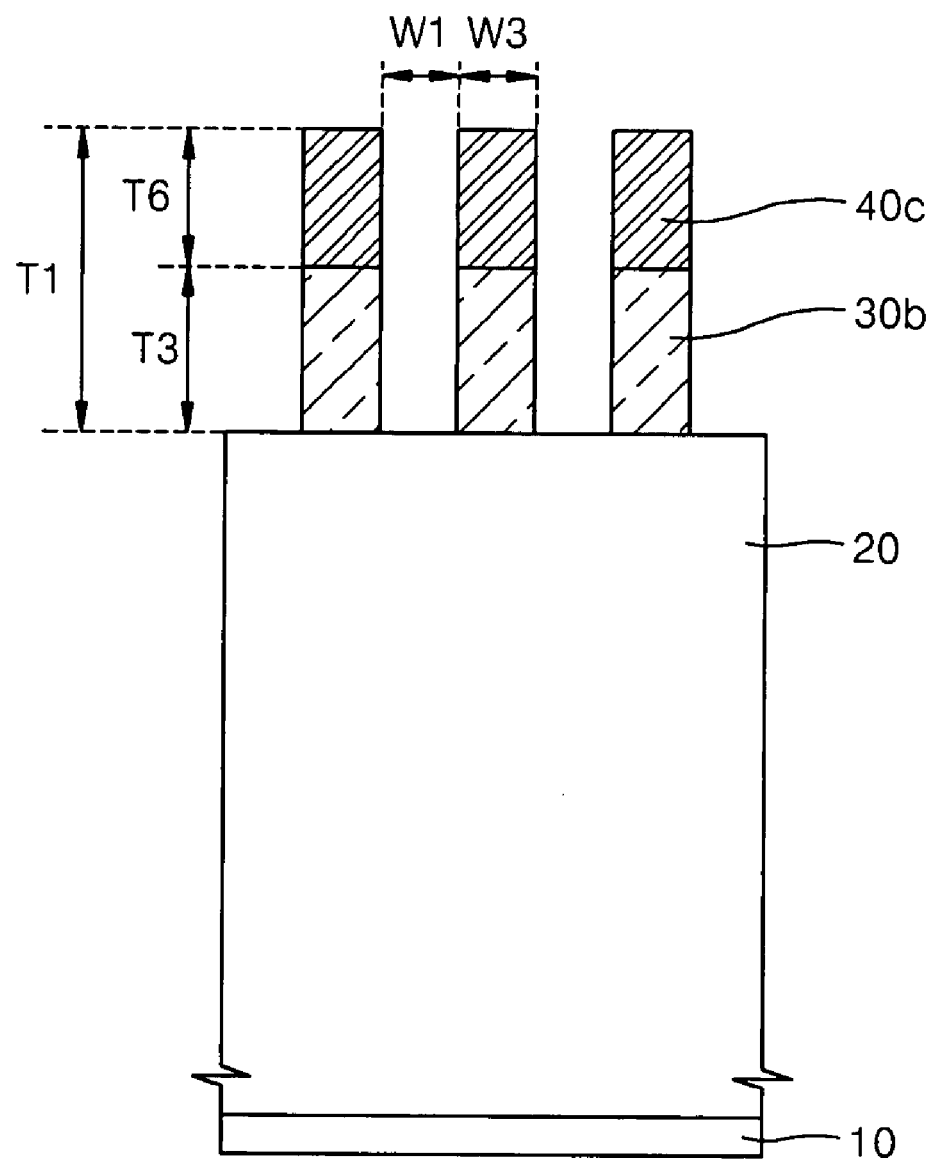
FIG. 6E is a cross-sectional view of the semiconductor device of FIG. 6A taken along line 6E-6E' of FIG. 6A.

Referring to FIGS. 5E and 6E showing the cross-sectional view taken along a line 6E-6E' of FIG. 6A, the first patterns 30a of the first material layer 30 exposed by the etching mask including the third patterns 40c of the second material layer 40 having the first width W1 are etched by the first thickness T1. The first patterns of the first material layer that are not exposed by the etching mask including the third patterns 40c of the second material layer 40 have a third width W3 and a third thickness T3 and is not etched.

According to an embodiment of the present invention, the first patterns 30a of the first material layer 30 exposed by the etching mask including the third patterns 40c and 40d of the second material layer 40 is etched to the depth equal to the first thickness T1 to form the second patterns 30b of the first material layer 30. Meanwhile, according to another embodiment of the present invention, the first patterns 30a of the first material layer 30 exposed by the etching mask including the third patterns 40c and 40d of the second material layer 40 are etched until the object layer 20 is exposed for the first time to form the second patterns 30b of the first material layer 30. When the first patterns 30a of the first material layer 30 are etched until the object layer 20 is etched for the first time, the object layer 20 is exposed in the cross-sections illustrated in FIGS. 6B and 6E, but is not exposed in the cross-sections illustrated in FIGS. 6C and 6D.

Figure 7A:
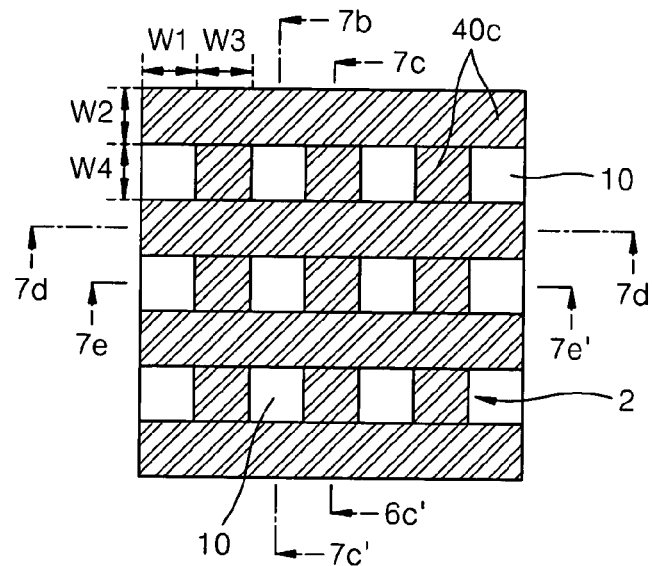

Referring to FIG. 7A, the object layer 20 exposed by the etching mask including the second patterns 30b of the first material layer 30 is etched to form the first patterns 20a of the object layer 20. A stopper layer 10 is formed below the object layer 20 to control the etching depth. Contact holes can be formed in the region where the stopper layer 10 is exposed by the etched object layer 20, and the region has the first width W1 and the fourth width W4 that form the sides of a rectangle. Hereinafter, cross-sections of the semiconductor device in which the first patterns 20a of the object layer 20 are formed will be described.

Figure 7B:
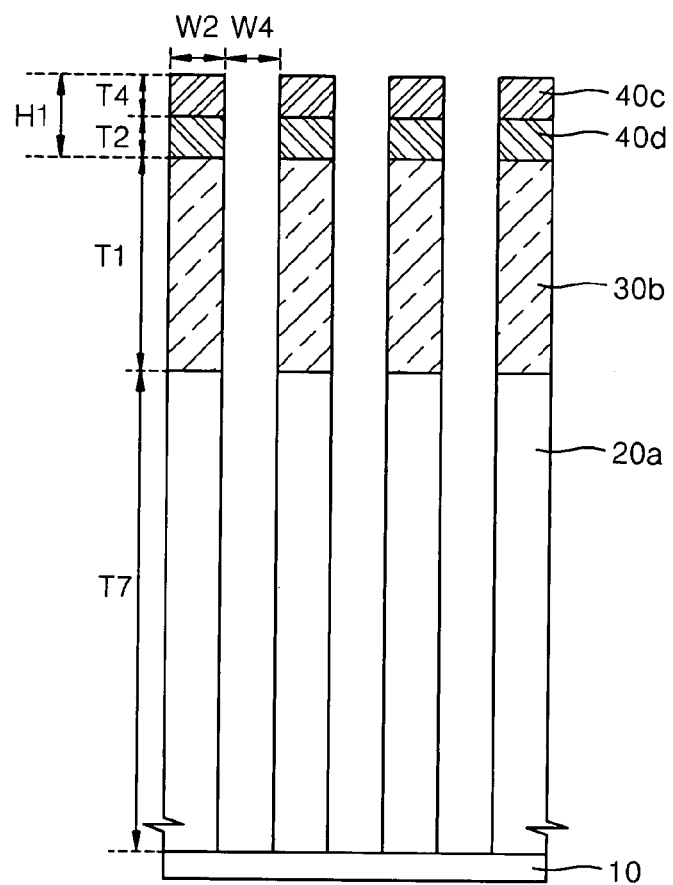
FIG. 7B is a cross-sectional view of the semiconductor device of FIG. 7A taken along line 7B-7B' of FIG. 7A.

Referring to FIGS. 6B and 7B showing the cross-sectional view taken along line 7B-7B' of FIG. 7A, the object layer 20 exposed by the etching mask including the second patterns 30b of the first material layer 30 is etched to form the first patterns 20a of the object layer 20. The first patterns 20a of the object layer 20 have the second width W2 and are separated from each other to the fourth width W4.

Figure 7C:
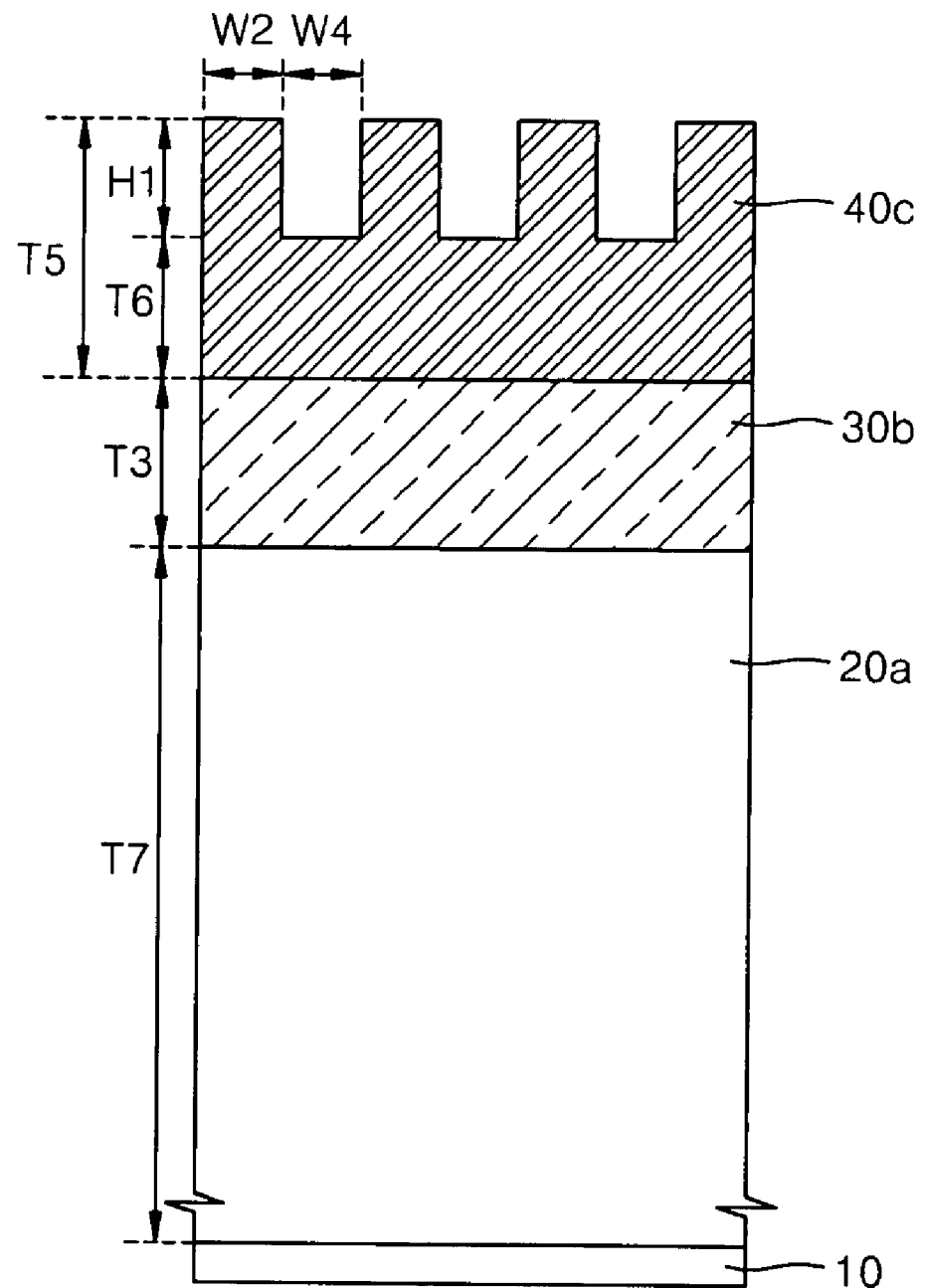
FIG. 7C is a cross-sectional view of the semiconductor device of FIG. 7A taken along line 7C-7C' of FIG. 7A.

Referring to FIGS. 6C and 7C showing the cross-sectional view taken along line 7C-7C' of FIG. 7A, since the object layer exposed by the etching mask including the second patterns 30b of the first material layer 30 is not present, the first patterns 20a of the object layer is not etched.

Figure 7D:
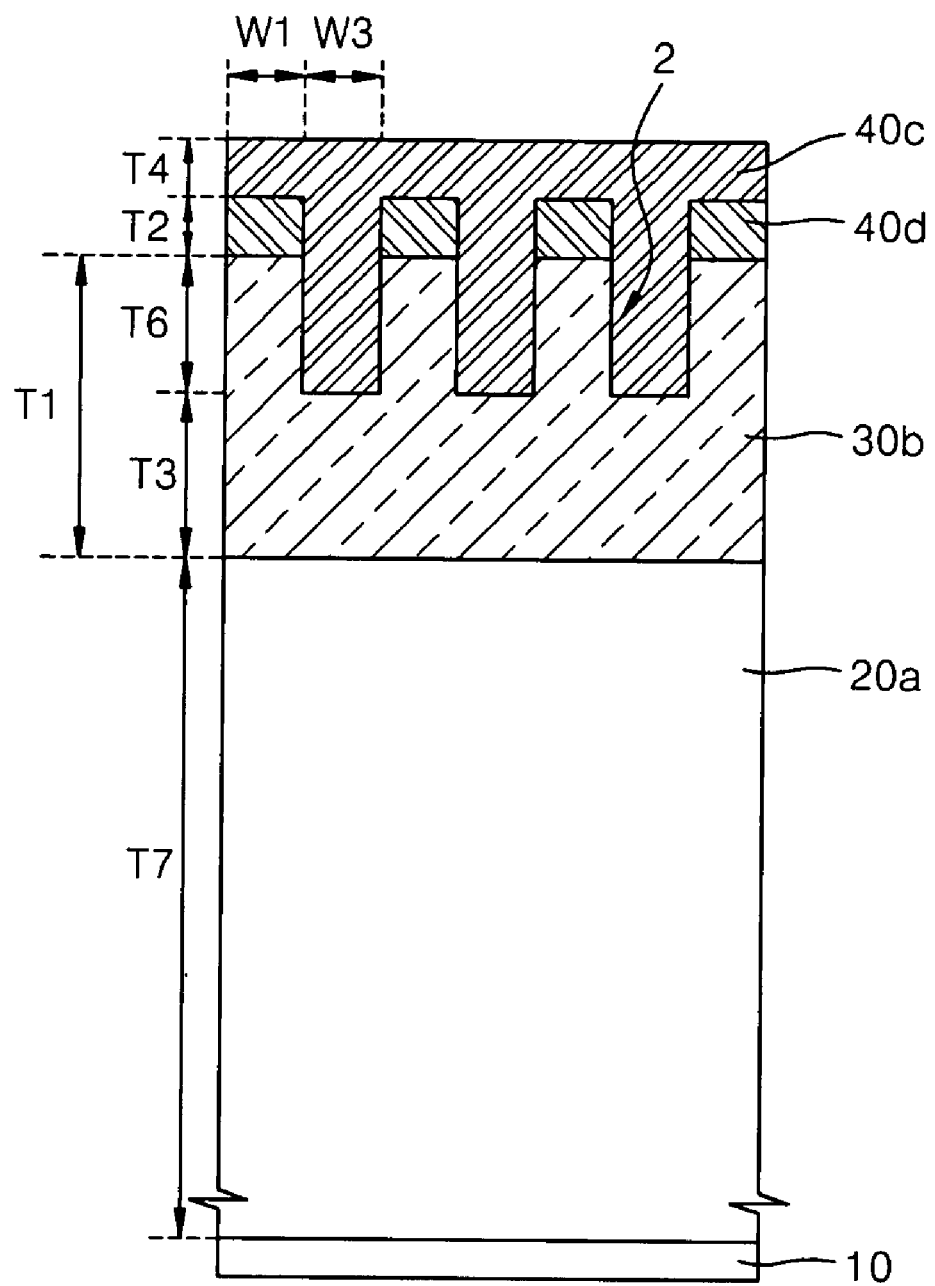
FIG. 7D is a cross-sectional view of the semiconductor device of FIG. 7A taken along line 7D-7D' of FIG. 7A.

Referring to FIGS. 6D and 7D showing the cross-sectional view taken along line 7D-7D' of FIG. 7A, since the object layer exposed by the etching mask including the second patterns 30b of the first material layer 30 is not present, the first patterns 20a of the object layer is not etched.

Figure 7E:
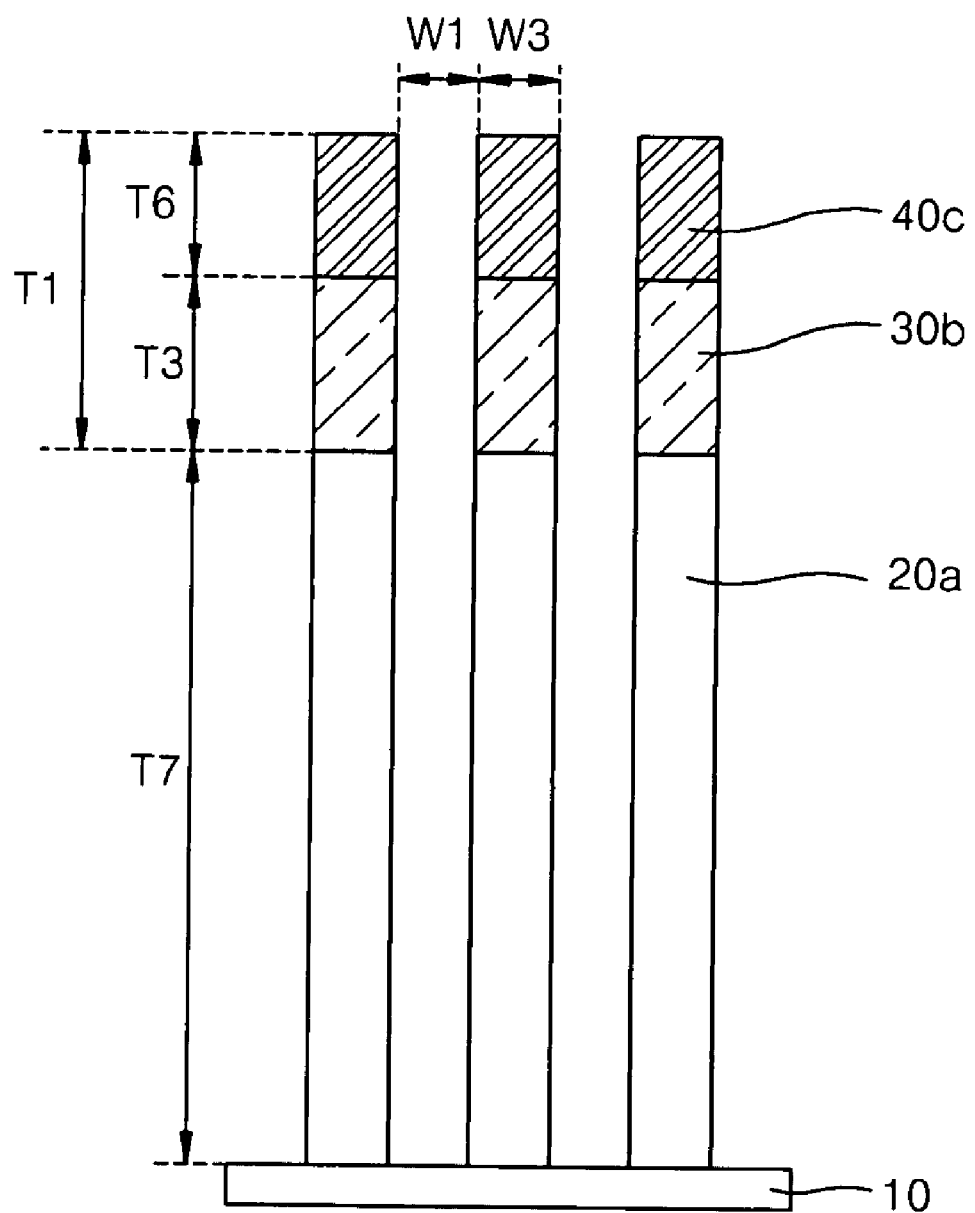
FIG. 7E is a cross-sectional view of the semiconductor device of FIG. 7A taken along line 7E-7E' of FIG. 7A.

Referring to FIGS. 6E and 7E showing the cross-sectional view taken along line 7E-7E' of FIG. 7A, the object layer exposed by the etching mask including the second patterns 30b of the first material layer 30 having the first width W1 are etched by a seventh width T7. Meanwhile, the object layer that is not exposed by the etching mask including the second patterns 30b of the first material layer 30 forms the first patterns 20a of the object layer having the third width W3 and the seventh thickness T7. Meanwhile, the third thickness T3 may be a minimum thickness or greater at which the second patterns 30b of the first material can remain while the object layer 20 is etched to a predetermined depth, for example, the seventh thickness T7 in order to exclude the possibility that the object layer below the second patterns 30b of the first material layer 30 be partially etched. Also, the first material layer 30 may be preferably formed of a material that can be removed using an ashing process or strip process. In particular, when the first material layer 30 includes ACL, the first material layer 30 can be easily removed using an $O_2$ ashing process or strip process. After the object layer 20 is removed, the second patterns 30b of the first material layer 30 that may remain on the first patterns 20a of the object layer can be removed using an ashing process or a strip process.

According to the method of manufacturing a semiconductor device of the present invention, minute patterns can be formed by double patterning.

While the present invention has been particularly shown and described with reference to exemplary embodiments thereof, the exemplary embodiments should be considered in descriptive sense only and not for purposes of limitation. For example, it will be understood by those skilled in the art that although the present invention relates to methods of manufacturing semiconductor devices in which contact holes are formed, the present invention is not limited thereto, and may also be applied to methods of forming gate patterns, capacitor patterns, and/or wire patterns, etc.

What is claimed is:

1. A method of manufacturing a semiconductor device, the method comprising:
    (a) forming a first material layer having a first thickness on an object layer;
    (b) forming a second material layer having a second thickness on the first material layer;
    (c) forming first patterns of a third material layer having lines and space patterns on the second material layer;
    (d) forming first patterns of the second material layer by etching the second material layer using the first patterns of the third material layer as an etching mask;
    (e) forming first patterns of the first material layer by etching the first material layer exposed by the etching mask including the first patterns of the second material layer to have a third thickness that is smaller than the first thickness;
    (f) forming second patterns of the second material layer having a planarized top surface on the first patterns of the first material layer and the first patterns of the second material layer, a fourth thickness on the first patterns of the second material layer, and a fifth thickness on the first patterns of the first material layer having the third thickness;
    (g) forming second patterns of the third material layer having lines and space patterns in a direction perpendicular to the first patterns of the third material layer on the second patterns of the second material layer;

(h) forming third patterns of the second material layer by etching the second patterns of the second material layer and the first patterns of the second material layer by a first depth that is smaller than the fifth thickness from the top surface of the second patterns of the second material layer using the second patterns of the third material layer as an etching mask;

(i) forming second patterns of the first material layer by etching the first patterns of the first material layer that is exposed by the etching mask including the third patterns of the second material layer by the same depth as the first thickness; and (j) etching the object layer exposed by the etching mask including the second patterns of the first material layer.

2. The method of claim 1, wherein in step (h), the first depth is equal to the sum of the fourth thickness and the second thickness.

3. The method of claim 1, wherein the third thickness in step (e) is equal to or greater than a minimum thickness of the second patterns of the first material layer that are determined such that the second patterns of the first material layer can remain when etching the object layer.

4. The method of claim 1, wherein the object layer, the first material layer, the second material layer, and the third material layer have different etching selectivities relative to one another.

5. The method of claim 1, wherein the first material layer is formed of a material that can be removed by an ashing process or a strip process.

6. The method of claim 5, further comprising, after step (j), removing the second patterns of the first material layer using an ashing process or a strip process.

7. The method of claim 1, wherein the second material layer is formed of a material that has an adhesive force with respect to the first material layer and fill recesses formed in the first material layer.

8. The method of claim 1, wherein the first material layer comprises an amorphous carbon layer (ACL).

9. The method of claim 8, wherein the ACL is formed using a coating method or a chemical vapor deposition (CVD) method.

10. The method of claim 8, wherein the second material layer comprises SiON.

11. The method of claim 10, wherein the third material layer comprises a photoresist layer.

12. The method of claim 11, wherein step (d) of forming the first patterns of the second material layer or step (h) of forming the third patterns of the second material layer comprises using etching gas containing at least one gas selected from a group consisting of $CF_4$, $CHF_3$, $CH_2F_2$, and $CH_3F$.

13. The method of claim 11, wherein step (e) of forming the first patterns of the first material or step (i) of forming the second patterns of the first material layer comprises using etching gas containing $O_2$ gas.

14. The method of claim 11, wherein step (j) of etching the object layer using etching gas containing at least one gas selected from a group consisting of $CF_4$, $CHF_3$, $CH_2F_2$, $C_4F_6$, $C_5F_8$, $C_3F_8$, and $C_2F_6$.

15. The method of claim 10, wherein in step (e), the difference between the first thickness and the third thickness is 1.5 times or greater the sum of the second thickness and the fourth thickness.

16. The method of claim 8, wherein the second material layer comprises an oxide layer.

17. A method of manufacturing a semiconductor device, the method comprising:

(a) forming a first material layer on an object layer on a semiconductor substrate;

(b) forming a second material layer on the first material layer;

(c) forming first patterns of a third material layer, in which a plurality of first line patterns are separated in parallel from one another, on the second material layer;

(d) forming first patterns of the second material layer by etching the second material layer using the first patterns of the third material layer as an etching mask;

(e) forming first patterns of the first material layer having recesses by etching a portion of the first material layer exposed by the etching mask comprising the first patterns of the second material layer;

(f) forming second patterns of the second material layer which fill the recesses and is planarized on the first patterns of the second material layer;

(g) forming second patterns of the third material layer formed of second line patterns that are separated in parallel to one another in a direction perpendicular to the first line patterns, on the second patterns of the second material layer;

(h) forming third patterns of the second material layer by etching the first patterns of the second material layer and the second patterns of the second material layer until the first patterns of the first material layer is exposed using the second patterns of the third material layer as an etching mask;

(i) forming second patterns of the first material layer by etching the first patterns of the first material layer that is exposed by the etching mask comprising the third patterns of the second material layer until the object layer is exposed; and (j) forming semiconductor patterns by etching the object layer that is exposed by the etching mask comprising the second patterns of the first material layer.

18. The method of claim 17, wherein the object layer, the first material layer, the second material layer, and the third material layer have different etching selectivities to one another.

19. The method of claim 17, wherein the first material layer is formed of a material that can be removed by an ashing process or a strip process.

20. The method of claim 19, further comprising, after step (j), removing the second patterns of the first material layer using an ashing process or a strip process.

21. The method of claim 17, wherein the second material layer is formed of a material that has adhesive force with respect to the first material layer and fill recesses formed in the first material layer.

22. The method of claim 17, wherein the first material layer comprises an amorphous carbon layer (ACL).

23. The method of claim 22, wherein the ACL is formed using a coating method or a chemical vapor deposition (CVD) method.

24. The method of claim 22, wherein the second material layer comprises SiON.

25. The method of claim 24, wherein the third material layer comprises a photoresist layer.

26. The method of claim 25, wherein step (d) of forming the first patterns of the second material layer or step (h) of forming the third patterns of the second material layer comprises using etching gas containing at least one gas selected from a group consisting of $CF_4$, $CHF_3$, $CH_2F_2$, and $CH_3F$.

27. The method of claim 25, wherein step (e) of forming the first patterns of the first material or step (i) of forming the second patterns of the first material layer comprises using etching gas containing $O_2$ gas.

28. The method of claim 25, wherein step (j) of etching the object layer using etching gas containing at least one gas selected from a group consisting of $CF_4$, $CHF_3$, $CH_2F_2$, $C_4F_6$, $C_5F_8$, $C_3F_8$, and $C_2F_6$.

29. The method of claim 22, wherein the second material layer comprises an oxide layer.

30. The method of claim 17, wherein in step (c), the first line patterns having a first width are separated in parallel to one another by a third width, and in step (g), the second line patterns having a second width are separated in parallel to one another by a fourth width, and in step (j), the semiconductor patterns are contact hole patterns having the first width and the fourth width as sides of a rectangle.

* * * * *